United States Patent
Asano et al.

(10) Patent No.: US 6,898,135 B2
(45) Date of Patent: May 24, 2005

(54) LATCH TYPE SENSE AMPLIFIER METHOD AND APPARATUS

(75) Inventors: Toru Asano, Omihachiman (JP); Sang Hoo Dhong, Austin, TX (US); Takaaki Nakazato, Austin, TX (US); Osamu Takahashi, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/606,587

(22) Filed: Jun. 26, 2003

(65) Prior Publication Data

US 2004/0264276 A1 Dec. 30, 2004

(51) Int. Cl.[7] .................................................. G11C 7/00
(52) U.S. Cl. ................................. 365/205; 365/185.17
(58) Field of Search ............................ 365/205, 185.17

(56) References Cited

U.S. PATENT DOCUMENTS 3,969,706 A * 7/1976 Proebsting et al. ..... 365/189.02
4,894,803 A * 1/1990 Aizaki ................... 365/189.05

* cited by examiner

*Primary Examiner*—M. Tran
(74) *Attorney, Agent, or Firm*—Carr LLP; Robert M. Carwell

(57) ABSTRACT

Disclosed is an apparatus for and a method of overcoming signal delay problems in a read-out path occurring in connection with pipelined memory circuits. A latch type sense amplifier (SA) is used to receive the memory cell logic levels during a pre-charge state in a cycle prior to read-out. Thus, the SA may quickly provide an output signal during a read latch clock cycle. The SA output is passed through a dynamically enabled logic circuit to a latch circuit for holding the receiving logic value for use in the next clock cycle.

11 Claims, 2 Drawing Sheets

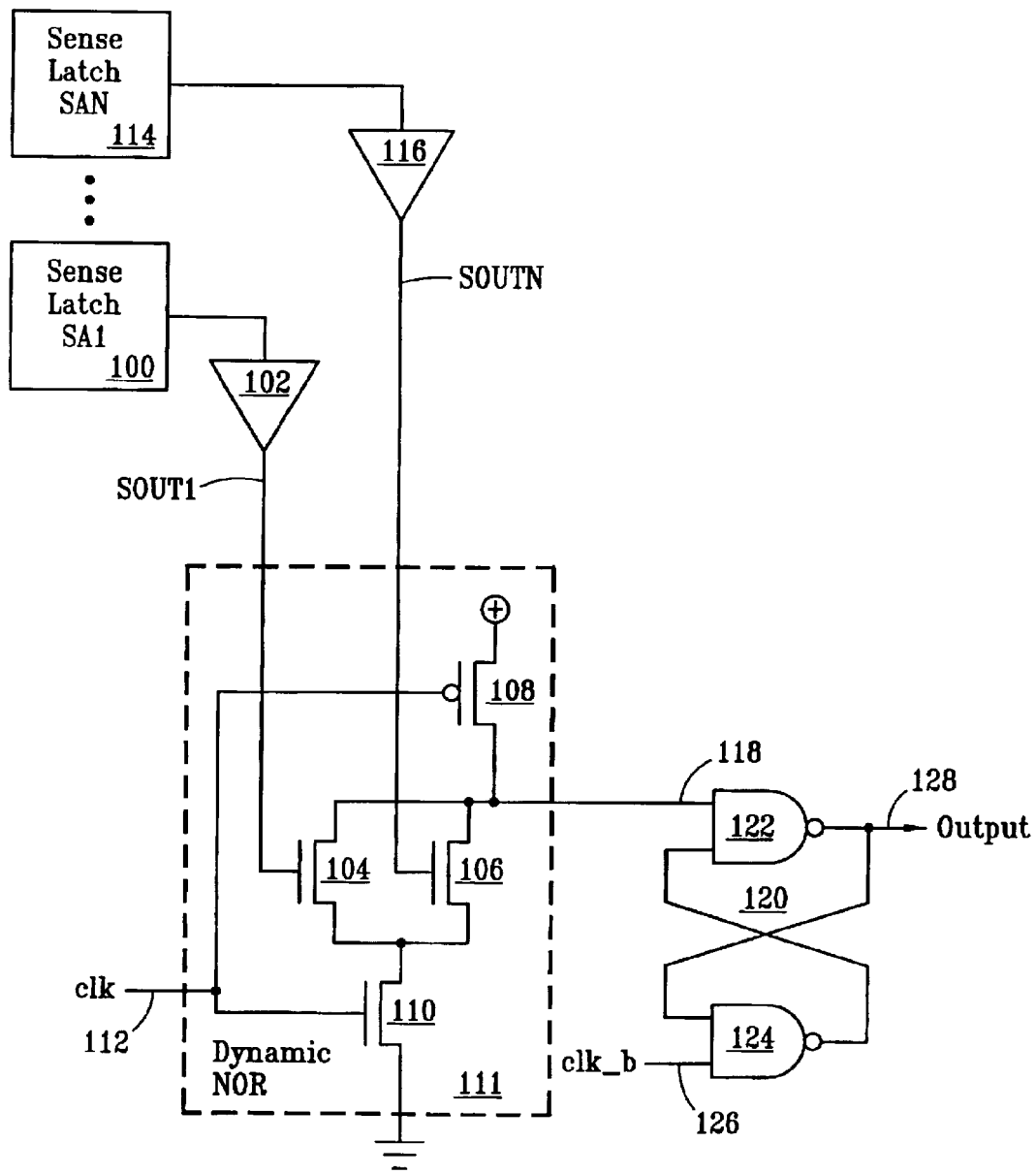

US 6,898,135 B2

LATCH TYPE SENSE AMPLIFIER METHOD AND APPARATUS

TECHNICAL FIELD

The present invention relates in general to capturing the output of a memory cell sense amplifier operating in conjunction with a high frequency circuit such as pipelined memory.

BACKGROUND

Typical prior art SAs (Sense Amplifiers) used in conjunction with SRAM (Static Random Access Memory) provide only dynamic output signals. Thus the output needs to be captured within the period of the read cycle by a read-out latch. When operating in conjunction with a high frequency pipeline SRAM, such a dynamic output signal is hard to catch and distribute. Further, transmission delay concerns require that the SA be physically close to the read-out latch in these prior art circuits. When applicable, multiple SA outputs may be collected by a dynamic dotted OR circuit. Such a dotted OR circuit consumes relatively large amounts of power, especially when operating in the dynamic mode, and further occupies a large amount of space on an integrated circuit chip. The alternative to the use of a dotted OR circuit, when collecting multiple SA outputs, is to multiplex the SA outputs to a load.

It would thus be desirable to be able to design a multiple SA read-out path that has relatively low power consumption and does not require that the SA be physically close to the read-out latch.

SUMMARY OF THE INVENTION

The present invention relates in general to minimizing power and circuit layout requirements for circuitry required in a high frequency memory sense amplifier read-out path.

BRIEF DESCRIPTION OF THE DRAWINGS

For a more complete understanding of the present invention, and its advantages, reference will now be made in the following Detailed Description to the accompanying drawings, in which:

FIG. 3 is a diagram of the invention using a plurality of sense latch type SAs in combination with a dynamic NOR and a cross-coupled NAND latch to access multiple memory locations.

DETAILED DESCRIPTION

Figure 1:
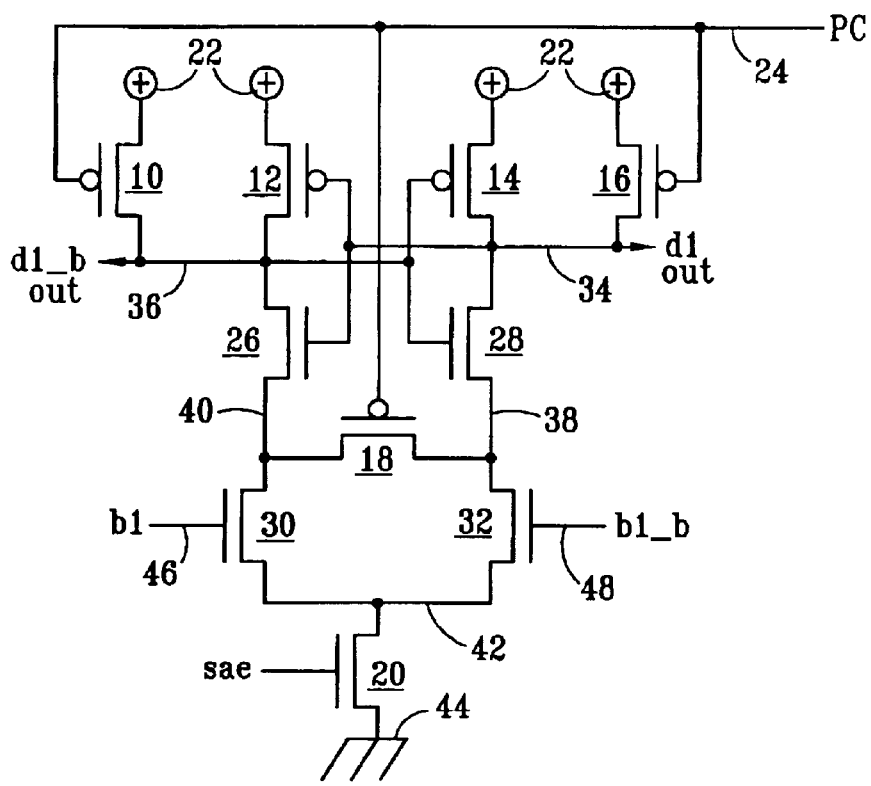
FIG. 1 is a schematic diagram of a sense latch type sense amplifier as used in this invention.

In FIG. 1, a plurality of P type or P channel FET (field effect transistors) 10, 12, 14, 16, and 18 are shown. FETs 10, 12, 14, and 16 each have their source terminal connected to a positive voltage designated as 22. The gate of each of FETs 10, 16 and 18 are connected to a lead 24 that provides a PC (pre-charge) signal. This signal may be identical to that shown as an SAE (SA enable) and a PC signal in FIG. 2. An N type FET 20 is shown having the SAE signal of FIG. 2 supplied to the gate thereof. Further N type or N channel FET transistors are labeled as 26, 28, 30, and 32. As known to those skilled in the art, P type FETs act as closed switches or, in other words, turn ON to allow current flow from source to drain when the gate terminal is at a low potential with respect to the source. When the gate is open, or the same potential as the source, the FET is OFF or, in other words, does not conduct electricity. On the other hand, N type FETs act as closed or ON switches to allow current flow therethrough when the gate terminal is high or positive with respect to the source. An output lead 34, further labeled as dl (data line) is connected to the drains of FETs 14 and 16, to the drain of FET 28 and to the gates of FETs 12 and 26. An output lead 36, further labeled as dl_b (an opposite polarity or complementary waveform data line) is connected to the drains of FETs 10 and 12, to the drain of FET 26 and to the gates of FETs 14 and 28. A lead 38 is connected to the source of FET 28 and to the drain of FET 32. A lead 40 is connected to the source of FET 26 and to the drain of FET 30. The source and drain leads of FET 18 are connected between leads 38 and 40. A lead 42 interconnects the sources of FETs 30 and 32 to the drain of FET 20. The source of FET 20 is connected to ground or reference potential 44. FETs 12 and 26, as well as 14 and 28, are physically inter-connected to act in the same manner as commercially available CMOS (complementary metal oxide on silicon) FETs.

Figure 2:
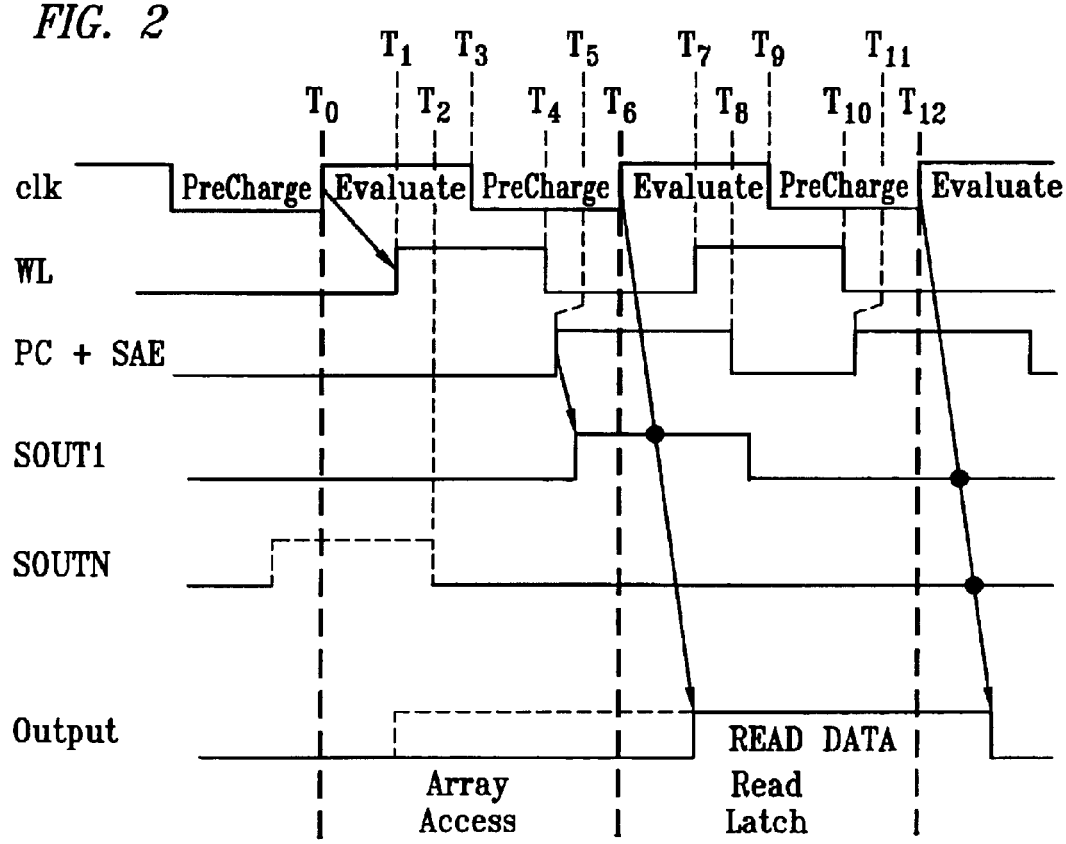
FIG. 2 comprises a set of waveforms used in describing the present invention.

A plurality of signal waveforms are shown in FIG. 2 using the same labels as used in FIG. 1 and in FIG. 3. The description of operation covers two clock cycles for retrieving and outputting data from a single memory cell location. As shown, the first clock cycle is labeled "Array Access," where the SA is prepared, or otherwise setup, to read the memory cell. The second clock cycle is labeled "Read Latch" where the cell data information is transferred to an output latch. The first clock cycle is further divided into time periods from $T_0$ to $T_6$ corresponding to waveform transitions shown. The second time period is divided into time periods $T_6$ to $T_{12}$. The clock period is further divided into evaluate and precharge periods where the evaluate period is a high potential and lasts from $T_0$ to $T_3$ in the first cycle and from $T_6$ to $T_9$ in the second cycle. In the precharge periods, intermediate the launch periods, the clock is at a low potential. A WL (word line) waveform goes positive or to a high potential at times $T_1$ and $T_7$ and goes negative or to a low potential at times $T_4$ and $T_{10}$. A PC (pre-charge) and SAE (sense amplifier enable) signal is normally high and goes negative at times $T_2$ and $T_8$ and returns positive at times $T_5$ and $T_{11}$. An SOUT1 waveform is representative of the output of SA1 after passing through an inverter, as shown in FIG. 3. This signal commences soon after time $T_5$ when the SAE signal goes positive during the pre-charge period. The SOUT1 signal falls soon after $T_8$, which represents the negative going time of the SAE signal. The SOUTN waveform represents the Nth SA of an array feeding a dynamic NOR gate shown in FIG. 3. While not discussed in detail, a dash line pulse is shown to indicate that the Nth SA would have had an output somewhat before time $T_0$ and this data would have been read during a dash line period shown in the OUTPUT waveform starting at time $T_1$. However, for the action being described with respect to SA1, this data shown as SOUT1 is read, starting at time $T_7$ and ending the time of one clock period later, and is labeled as READ DATA.

In FIG. 3, a sense latch type SA1 block is labeled 100 and is shown having an output that passes through an inverter 102 to become SOUT1. The SOUT1 output is applied to an N channel or N type FET 104. FET 104 is shown connected in parallel with a similar FET 106 between FETs 108 and 110 to form a dynamic NOR circuit 111 as enclosed by a dash line box. As shown, the FET 108 is a P type FET and has its source connected to a positive power supply, while the source of N type FET 110 is connected to ground potential. A clock signal (clk) is provided on a lead 112 to the gates of FETs 108 and 110. A sense latch type SA 114 represents the Nth one of a series of SAs supplying data from a plurality of N memory cells. As few as two memory cells and associated SAs, a dynamic logic and latch, are required to practice this invention. Operationally speaking, however, in a typical embodiment, the dynamic NOR receives data from a set of 8 or 16 SAs. The SAs of a set are activated only one at a time. Each SA receives data from a cell selected by a source generating the waveform labeled WL. An output of SA 114 is passed through an inverter 116 to the gate of FET 106 as signal SOUTN. Additional SAs, as represented by the three dots between SAs 114 and 100, would require an appropriate additional number of FETs in the NOR gate 111 in parallel with FETs 104 and 106. An output of the NOR gate 111 is provided on a lead 118 to a NAND latch 120 and specifically to a NAND gate 122 comprising a part of latch 120. The NAND gate 122 is cross-coupled to a further NAND gate 124 in a latching configuration. A clk_b signal is applied as a second input to the NAND gate 124. The clk_b signal is the inverse of the clock (clk) signal on lead 112. An output of the invention is provided on a lead 128 of the latch 120.

In typical operation, there is a separate set of signals, as represented by the WL, SAE and PC waveforms, for each memory cell to be read. Further, an output will typically be provided from a different memory cell of each of a word of memory cells in consecutive clock cycles as mentioned above in conjunction with the dash line representations in FIG. 2.

Referring now to FIGS. 1 and 2, it may be assumed that the SA of FIG. 1 has been selected to sense a given memory cell. Between times $T_2$ and $T_5$, the PC and SAE signals are low in potential, thus turning ON the FETs 10, 16 and 18 to bring the outputs 34 and 36 to substantially the same potential as the power terminal nodes 22 for a pre-charge state. Also, the leads 38 and 40, through the action of FET 18, are brought to a substantially equal potential. The WL signal activates an action to place the memory cell data potential, which data output signal is in differential format, on leads 46 and 48 commencing during the pre-charge period at time $T_3$. By the time $T_5$, this signal, from the memory cell, is large enough to sense. At time $T_5$, PC and SAE go high, thus turning OFF the P type FETs and turning ON the N type FETS including the FET 20 such that the FETs 30 and 32 can sense the relative polarity of the two inputs on leads 46 and 48. If lead 46 is higher in potential than lead 48, output lead 36 goes low while lead 34 remains at the high or pre-charged state. Although the output may be taken from either lead 34 or 36, it may be assumed that it is taken from lead 36, and inverted in inverter 102 of FIG. 3 to produce the signal SOUT1 as shown in FIG. 2. As may be observed from FIG. 2, the SA 100 commences the memory cell sensing action at about time $T_3$ but does not provide a signal to the NOR circuit 111 until after time $T_6$ due to the delayed operation of signals passing through the various switches in the SA and whatever delays are presented by the transmission line or lead, including the inverter 102, between the SA and the NOR 111. It may also be noted that the inverters are not required to practice the invention but when used provide design freedom in the length of the connection path between the sense latches and the NOR circuit 111.

The NOR 111 is activated, for the data to be received from SA 100, by the clock received on lead 112 at time $T_6$. This data logic level is transferred to the latch 120, which holds the data for one clock cycle shown as READ DATA in connection with the OUTPUT waveform in FIG. 2.

Although the invention has been described with reference to a specific embodiment, this description is not meant to be construed in a limiting sense. Various modifications of the disclosed embodiment, as well as alternative embodiments of the invention, will become apparent to persons skilled in the art upon reference to the description of the invention. It is therefore contemplated that the claims will cover any such modifications or embodiments that fall within the true scope and spirit of the invention.

What is claimed is:

1. A method of transferring a data bit out of a given cell of an array of memory cells to a latch circuit, comprising the steps of:
   selecting a given cell of an array of cells with a first signal;
   activating a given SA (sense amplifier), of a plurality of associated SAs, with an enabling second signal to provide a given SA memory cell indicative third signal output;
   dynamically NORing a plurality of SA third signal outputs after each one of a series of cyclically occurring pre-charge periods; and
   storing and outputting the third signal, in a read latch circuit, for a predetermined interval.

2. A sense amplifier read-out path circuit for high frequency pipelined memory, comprising:
   a pair of latch type sense amplifiers defining corresponding respective outputs;
   a read latch comprised of NAND logic; and
   a clocked switch disposed between the latch and the sense latches receiving the outputs and delivering one of the outputs to the read latch.

3. A method of transferring a data bit out of a given cell of an array of memory cells to a latch circuit, comprising the steps of:
   selecting a given cell of an array of cells with a first signal;
   activating a given latch type SA (sense amplifier) of a plurality of latch type SAs, the given SA being associated with said given cell, with an enabling second signal to provide an output signal indicative of the logic value of said given cell;
   logically combining the outputs of all of said plurality of latch type SAs to dynamically pass the third signal output of the activated SA after each one of a series of cyclically occurring pre-charge periods; and
   receiving and storing the passed third signal, in a read latch circuit, for an output during predetermined interval subsequent to the time of detecting the cell logic value.

4. Apparatus for providing a read-out path for high frequency pipelined memory, comprising:
   a plurality of memory cells;
   a latch type SA (sense amplifier) connected to each of said plurality of memory cells and operating to sense the logic value of the connected memory cell upon receipt of an enabling signal and subsequently providing an SA output signal indicative of said logic value;
   a latch circuit operating to hold a received signal for a predetermined time; and
   a dynamic circuit interconnected between each of said latch type SAs and said latch circuit, the dynamic circuit being operable to pass the output signal of the last enabled SA to said latch circuit.

5. Apparatus for providing a read-out path for a plurality of memory cells in a high frequency pipelined memory circuit, comprising:

a plurality of latch type SAs (sense amplifiers) each operable to sense the logic value of a like plurality of memory cells upon receipt of an enabling signal and subsequently providing an SA output signal indicative of said logic value;

a latch output circuit operating to hold a received memory cell logic value indicative signal for a predetermined time; and a dynamic logic signal passing circuit interconnected between an output of each of said plurality of latch type SAs and said latch output circuit.

6. The apparatus of claim 5, wherein:

the dynamic logic signal passing circuit is a dynamic NOR; and the latch output circuit is a cross coupled NAND.

7. A method of transferring a data bit out of a given cell of an array of memory cells as a logic value indicative signal to a latch circuit, comprising the steps of:

applying a given memory cell logic value to a sense amplifier (SA) during a pre-charge condition prior to enabling operation of said SA;

enabling said SA to provide an output signal indicative of the logic value of the given memory cell data substantially immediately after enablement;

passing said output signal to a latch circuit comprising a cross-coupled NAND, wherein the SA holds the logic level of the output for a predetermined time after enablement, and wherein the passing of the signal to a latch circuit is accomplished via a dynamic NOR.

8. The method of claim 7, wherein a plurality of memory cells is being read by a like plurality of SAs in consecutive clock cycle time periods and, wherein:

the outputs of each of the plurality of SAs are logically combined in a dynamic manner before passing of the output signal to the latch circuit.

9. The method of claim 7, wherein the SA provides a latching type action of the output signal for a predetermined time after enablement.

10. A method of providing a read-out path for high frequency pipelined memory, comprising the steps of:

sensing the value of a memory cell in a latch type SA (sense amplifier) in a given clock cycle;

holding the sensed value for at least a predetermined time;

transferring the sensed value to a latch circuit in a dynamic NOR;

holding the sensed value, wherein the latch type SA holds a logic level of an output for a predetermined time after enablement; and outputting the transferred sensed value at a time subsequent to said given clock cycle.

11. Apparatus for providing a read-out path for high frequency pipelined memory, comprising:

a latch type SA (sense amplifier) operable to sense the value of a memory cell in a given clock cycle; and a latch circuit interconnected to said latch type SA for receiving the sensed value from said SA and outputting the transferred sensed value at a time subsequent to said given clock cycle;

an additional plurality of latch type SAs for sensing a like plurality of additional memory cells in individually distinct given clock cycles; and a dynamic logic circuit providing the interconnection between the plurality of SAs and the latch circuit.

* * * * *